(12) United States Patent
Shimoda

(10) Patent No.: US 7,193,490 B2
(45) Date of Patent: Mar. 20, 2007

(54) HIGH FREQUENCY TRANSMISSION LINE AND HIGH FREQUENCY BOARD

(75) Inventor: Hideaki Shimoda, Tokyo (JP)

(73) Assignee: TDK Corporation, Tokyo (JP)

( * ) Notice: Subject to any disclaimer, the term of this patent is extended or adjusted under 35 U.S.C. 154(b) by 57 days.

(21) Appl. No.: 10/822,007

(22) Filed: Apr. 12, 2004

(65) Prior Publication Data

US 2004/0257178 A1 Dec. 23, 2004

(30) Foreign Application Priority Data

Apr. 11, 2003 (JP) .............................. 2003-107523

(51) Int. Cl.
*H01P 3/08* (2006.01)
(52) U.S. Cl. ...................... 333/246; 333/236; 333/245
(58) Field of Classification Search ................ 333/236, 333/238, 245, 246
See application file for complete search history.

(56) References Cited

U.S. PATENT DOCUMENTS

| | | | | |
|---|---|---|---|---|
| 4,890,155 | A | * 12/1989 | Miyagawa et al. | ......... 174/524 |
| 5,251,108 | A | * 10/1993 | Doshita | ........................ 361/792 |
| 6,522,214 | B1 | * 2/2003 | Harju et al. | .................... 333/1 |
| 6,700,789 | B2 | * 3/2004 | Shirasaki | ..................... 361/748 |
| 6,726,488 | B2 | * 4/2004 | Shirasaki | ..................... 439/65 |

FOREIGN PATENT DOCUMENTS

| | | |
|---|---|---|
| EP | 0 358 497 | 3/1990 |
| FR | 2 625 373 | 6/1989 |
| JP | 6-21253 | 1/1994 |
| JP | 9-51208 | 2/1997 |
| JP | 9-172303 | 6/1997 |
| JP | 9-321507 | 12/1997 |
| JP | 9-321509 | 12/1997 |
| JP | 10-163713 | 6/1998 |
| JP | 2000-68715 | 3/2000 |
| JP | 2000-68716 | 3/2000 |
| JP | 2000-114801 | 4/2000 |
| JP | 2001-308547 | 11/2001 |

OTHER PUBLICATIONS

J. Kim, et al., Electrical Performance of Electronic Packaging, IEEE 7th Topical Meeting, XP-010313751, pp. 252-255, "Novel Microstrip-to-Stripline Transitions for Leakage Suppression in Multilayer Microwave Circuits", Oct. 26-28, 1998.

* cited by examiner

*Primary Examiner*—Robert Pascal
*Assistant Examiner*—Kimberly E Glenn
(74) *Attorney, Agent, or Firm*—Oblon, Spivak, McClelland, Maier & Neustadt, P.C.

(57) ABSTRACT

Since a width of an edge portion of a signal line of a first high frequency transmission line is changed with respect to a width of another portion thereof, a deviation of impedances in a connection portion of the first and second high frequency transmission lines can be suppressed, so that signal reflections occurred in the connection portion can be lowered and a signal passing characteristic is improved.

8 Claims, 8 Drawing Sheets

HIGH FREQUENCY TRANSMISSION LINE AND HIGH FREQUENCY BOARD

BACKGROUND OF THE INVENTION

The present invention is related to a high frequency transmission line. More specifically, the present invention is directed to a high frequency transmission line which is fabricated by combining different high frequency transmission lines with each other, and also directed to a high frequency board on which these different high frequency transmission lines are wired.

Conventionally, either microstrip lines or triplate lines are known as high frequency transmission lines for transmitting the high frequency signals. Generally speaking, as indicated in FIG. 14, a microstrip line is constituted by a dielectric substrate 2, a ground conductor (ground layer) 1, and a signal line (signal conductive line) 3. The ground conductor 1 has been formed on a lower plane (namely, lower layer) of this dielectric substrate 2. The signal line 3 has been formed on an upper plane (namely, upper layer) of this dielectric substrate 2. It should be noted that FIG. 14 shows a sectional view in the case that the microstrip line is viewed from a sectional plane perpendicular to the direction of the signal line 3. In the microstrip line shown in this example, dimensions and the like of the respective conductors have been set to the following values: For instance, a thickness of the dielectric substrate 2 is set to 320 µm; a width of the signal line 3 is set to 500 µm; and a characteristic impedance is set to 50 ohms.

Also, as indicated in FIG. 15, a triplate line is constituted by a dielectric substrate 2, ground conductors 1, and a signal line (signal conductive line) 4. The ground conductors 1 have been formed on both an upper plane and a lower plane (namely, both upper layer and lower layer) of this dielectric substrate 2. The signal line 4 has been embedded in an inner layer of the dielectric substrate 2 in such a manner that this signal line 4 is sandwiched by the upper and lower ground conductors 1. It should be noted that FIG. 15 also shows a sectional view in the case that the triplate line is viewed from a sectional plane perpendicular to the direction of the signal line 4. In the triplate line shown in this example, dimensions and the like of the respective conductors have been set to the following values: For instance, a thickness of the dielectric substrate 2 is set to 320 µm; a width of the signal line 4 is set to 115 µm; and a characteristic impedance is set to 50 ohms.

The above-described microstrip line, or the above-explained triplate line transmits high frequency signals having frequencies of e.g., 20 to 30 GHz along a direction of either the signal line 3 or the signal line 4 by electromagnetically coupling the signal line 3 to the ground conductor 1, or by electromagnetically coupling the signal line 4 to the ground conductors 1.

On the other hand, in the case that a high frequency signal is transmitted by employing both a microstrip line and a triplate line, for example, in such a case that in a high frequency board, such a high frequency signal received by an antenna which has been formed on a front surface of the high frequency board is conducted to a high frequency circuit which has been formed inside the high frequency board, or on a rear surface thereof, as represented in FIG. 16, the signal line 3 of the microstrip line is simply connected to the signal line 4 of the triplate line by way of a via hole conductor 6. Then, the high frequency signal is transmitted through such a high frequency transmission line which has been formed by connecting these signal lines 3 and 4 to each other (note that FIG. 16 is sectional view in such case that area located in vicinity of connection portion between both signal lines 3 and 4 is viewed from sectional plane located parallel to signal line direction). However, in such a connection structure, signal reflections occurred at the connection portion are increased with respect to the above-described high frequency signals, so that the high frequency signals can hardly pass through this connection portion.

On the other hands, there is one public knowledge example (for example, refer to patent publication 1) which indicates a connection structure capable of reducing signal reflections which are produced in a connection portion between high frequency transmission lines having two same constructions. However, this known connection structure cannot be directly applied to a connection portion between two high frequency transmission lines having different structures from each other.

Also, there are other public knowledge examples (for instance, refer to patent publications 2 and 3) capable of reducing signal reflections which are produced at a connection portion of high frequency transmission lines having different structures. However, any of methods disclosed in these public knowledge examples is realized based upon such an initial condition that the respective signal lines are present on the same plane. As previously explained, these public knowledge methods cannot be applied to such a case that the signal lines are arranged in different dielectric substrate layers.

[Patent Publication 1]
  Japanese Laid-open Patent Application No. 2000-114801

[Patent Publication 2]
  Japanese Laid-open Patent Application No. 2000-068715

[Patent Publication 3]
  Japanese Laid-open Patent Application No. Hei-9-321507

As explained above, in such a structure that the microstrip line is simply connected to the triplate line by way of the via hole conductor 6, since there is a difference between the signal line widths of the transmission lines, a deviation of impedances is produced in the connection portion. This impedance deviation does not cause a serious problem in such a case that a frequency of a transmission signal is low. However, when a frequency of a transmission signal is high, this impedance deviation cannot be neglected. As a result, an impedance matching condition can be no longer established in the connection portion, and thus, reflections of transmission signals may occur, which may cause a signal passage characteristic to be deteriorated.

SUMMARY OF THE INVENTION

The present invention has been made to solve the above-explained problems of the conventional techniques, and has an object to provide a high frequency transmission line and a high frequency board using this high frequency transmission line. That is, in such a case that a high frequency line is constructed by connecting different high frequency transmission lines to each other, the high frequency transmission line is capable of reducing signal reflections occurred at a connection portion between these different high frequency transmission lines, and thus owns a superior signal passing characteristic.

To achieve the above-described object, according to first aspect of the present invention, a high frequency transmission line includes: a first high frequency transmission line having a signal line, a width of an edge portion thereof being different from a width of another portion thereof; and a second high frequency transmission line different from the first high frequency transmission line, having a signal line which is connected to the edge portion of said signal line of the first high frequency transmission line.

In accordance with the present invention, since the width of the edge portion of the signal line of the first high frequency transmission line is changed with respect to the width of another portion thereof, the deviation of the impedances in the connection portion of the first and second high frequency transmission lines can be suppressed.

Preferably, the first and second high frequency transmission lines own the signal lines in different layers of a dielectric substrate respectively, the edge portion of the signal line of the first high frequency transmission line is arranged to overlap with the signal line of the second high frequency transmission line, and a connection conductor is provided to connect said edge portion of the first high frequency transmission line to the edge portion of the second high frequency transmission line.

In accordance with the present invention, the width of the edge portion of the signal line of the first high frequency transmission line is changed, and this edge portion is connected to the signal line of the second high frequency transmission line via the connection conductor. As a result, the deviation of the impedances in the connection portion of the first and second high frequency transmission lines can be suppressed.

Further, it is preferable that the edge portion of the second high frequency transmission line has a width which is different from a width of another portion thereof.

In accordance with the present invention, since the width of the edge portion of the signal line of the second high frequency transmission line is also changed with respect to the width of another portion thereof, the deviation of the impedances in the connection portion of the first and second high frequency transmission lines can be further suppressed.

Further, it is preferable that the high frequency transmission line is further comprised of a conductor for shortening a distance between a ground conductor and the signal line of the first high frequency transmission line.

In accordance with the present invention, since the conductor for shortening the distance to the ground conductor is provided, the width of the signal line of the first high frequency transmission line is adjusted, and the deviation of the impedances in the connection portion can be further reduced.

According to the second aspect of the present invention, a high frequency transmission line includes: a first high frequency transmission line having a signal line in a layer of a dielectric substrate; a second high frequency transmission line having a signal line in a different layer of a dielectric substrate; a third signal line which is provided in a layer between the first signal line of the first high frequency transmission line and the second signal line of the second high frequency transmission line, and which is formed in such a manner that one edge of the third signal line is overlapped with the first signal line and another edge thereof is overlapped with the second signal line of the second high frequency transmission line; a first connection conductor for connecting the first signal line to the one edge of the third signal line; and a second connection conductor for connecting the second signal line to the another edge of the third signal line.

In accordance with the present invention, since the third signal line is provided between the first signal line of the first high frequency transmission line and the second signal line of the second high frequency transmission line, the distance among the signal lines can be made short, the deviation of the impedances in the connection portions can be reduced.

Further, it is preferable that an edge portion of the first signal line connected to the first connection conductor owns a line width different from a line width of another portion thereof.

In accordance with the present invention, since the width of the edge portion of the first signal line of the first high frequency transmission line is further changed, the impedance can be adjusted in the two stages, so that the deviations of the impedances in the connection portion can be further reduced.

Also, it is preferable that an edge portion of the second signal line connected to the second connection conductor owns a line width different from a line width of another portion thereof.

In accordance with the present invention, since the width of the edge portion of the signal line of the second high frequency transmission line is further changed, the impedance adjusting portion can be increased, so that the deviations of the impedances in the connection portion can be further reduced.

Further, it is preferable that a width of the third signal line is set between the first signal line and the second signal line.

In accordance with the present invention, in addition to inserting of the third signal line, the width of the third signal line is adjusted, so that the signal line width can be changed in a step manner, and the deviation of the impedances in the connection portion can be further lowered.

Further, it is preferable that the third signal line is arranged in a step form in such a manner that one edge of the third signal line is overlapped with a line of an upper layer and another edge of the third signal line is overlapped with a line of a lower layer, and owns at least one, or more lines, the overlapped portions of which are connected to each other; a line width of a partial line within the lines is defined between a width of the first signal line and a width of the second signal line; and the line width is changed in a step manner among the lines.

In accordance with the present invention, since the third signal line is formed by at least one, or more lines which have been fabricated in a hierarchical manner, and the line width is changed in the step manner, the deviations of the impedances in the connection portions can be furthermore decreased, while it is possible to avoid that the signal line width in the connection portion is changed in short order.

Moreover, it is preferable that a conductor for shortening a distance between the first signal line and a ground conductor is further provided.

In accordance with the present invention, since the conductor for shortening the distance to the ground conductor is employed, the width of the signal line of the first high frequency transmission line is adjusted, so that the deviation of the impedances in the connection portion can be further reduced.

Also, according to third aspect of the invention, a high frequency transmission line includes: a first high frequency transmission line having a signal line in a layer of a dielectric substrate; a second high frequency transmission line having a signal line in a different layer of a dielectric substrate, the edge portion being overlapped with said signal line of said first high frequency line; a connection conductor for connecting said signal line of said first high frequency transmission line to said edge portion of said second high frequency transmission line; and a conductor for shortening a distance between said signal line of said first high frequency transmission line and a ground conductor.

In accordance with the present invention, since the conductor for shortening the distance to the ground conductor is employed, the width of the signal line of the first high frequency transmission line is adjusted, so that the deviation of the impedances in the connection portion can be further reduced.

Further, according to forth aspect of the invention, a high frequency board for conducting a high frequency signal to a high frequency circuit via a high frequency transmission line which contains a first high frequency line and a second high frequency line different from said first high frequency line, wherein the high frequency transmission line includes: a first high frequency transmission line having a signal line, a width of an edge portion thereof being different from a width of another portion thereof; and a second high frequency transmission line different from said first high frequency transmission line, having a signal line which is connected to the edge portion of said signal line of the first high frequency transmission line.

In accordance with the present invention, since the width of the edge portion of the signal line of the first high frequency transmission line is changed with respect to the width of another portion thereof, the deviation of the impedances in the connection portion of the first and second high frequency transmission lines can be suppressed.

Further, a signal line of the first high frequency transmission line, a width of an edge portion thereof being different from a width of another portion thereof; a signal line of the second high frequency transmission line arranged in such a manner that an edge portion thereof is overlapped with the edge portion of the first high frequency transmission line; and a connection conductor for connecting the edge portion of the first high frequency transmission line to the edge portion of the second high frequency transmission line.

In accordance with the present invention, since the width of the edge portion of the signal line of the first high frequency transmission line is changed and this edge portion is connected to the signal line of the second high frequency transmission line through the connection conductor, the deviation of the impedances in the connection portion of the first and second high frequency transmission lines can be suppressed.

Further, in accordance with fifth aspect of the invention, a high frequency board which conducts a high frequency signal to a high frequency circuit via a high frequency transmission line containing signal lines in different layers of a dielectric substrate, wherein the high frequency transmission line includes: a first high frequency transmission line having a signal line in a layer of a dielectric substrate; a second high frequency transmission line having a signal line in a different layer of a dielectric substrate; a third signal line which is provided in a layer between said first signal line of said first high frequency transmission line and said second signal line of said second high frequency transmission line, and which is formed in such a manner that one edge of said third signal line is overlapped with said first signal line and another edge thereof is overlapped with said second signal line of said second high frequency transmission line; a first connection conductor for connecting said first signal line to said one edge of said third signal line; and a second connection conductor for connecting said second signal line to said another edge of said third signal line.

In accordance with the present invention, since the third signal line is provided between the first signal line of the first high frequency transmission line and the second signal line of the second high frequency transmission line, the distance among the signal lines can be made short, so that the deviation of the impedances in the connection portions can be reduced.

Also, according to sixth aspect of the invention, a high frequency board which conducts a high frequency signal to a high frequency circuit via a high frequency transmission line containing signal lines in different layers of a dielectric substrate, wherein the high frequency transmission line includes: a first high frequency transmission line having a signal line in a layer of a dielectric substrate; a second high frequency transmission line having a signal line in a different layer of a dielectric substrate, the edge portion being overlapped with said signal line of said first high frequency line; a connection conductor for connecting said signal line of said first high frequency transmission line to said edge portion of said second high frequency transmission line; and a conductor for shortening a distance between said signal line of said first high frequency transmission line and a ground conductor.

In accordance with the present invention, since the conductor for shortening the distance to the ground conductor is employed, the width of the signal line of the first high frequency transmission line is adjusted, so that the deviation of the impedances in the connection portion can be further reduced.

DETAILED DESCRIPTION OF THE PREFERRED EMBODIMENTS (Embodiment Mode 1)

Figure 1:
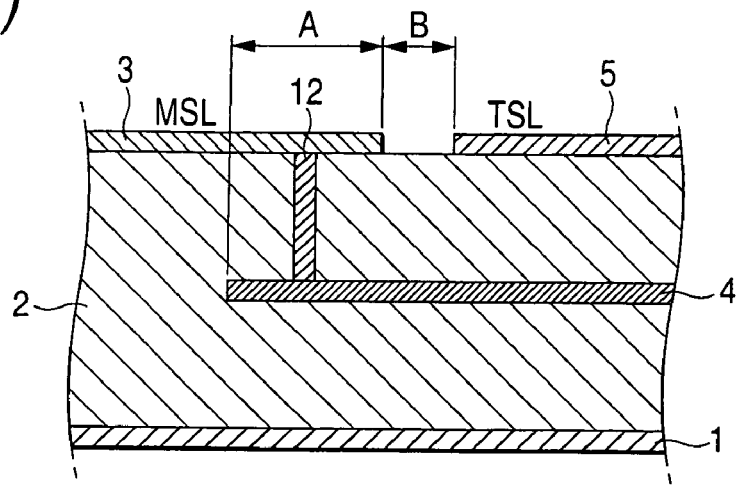
FIGS. 1A and 1B are a sectional view and a plan view, which show a construction of a high frequency transmission line according to a first embodiment of the present invention.
Figure 1:
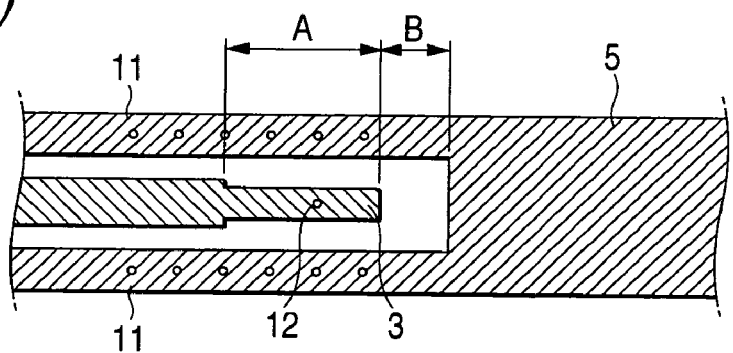

Next, a description is made of embodiment modes according to the present invention based upon drawings. FIG. 1 is a sectional view and a plane view, which represent a connection structure of a high frequency transmission line according to a first embodiment mode of the present invention. It should be noted that the same reference numerals shown in the prior art will be employed as those for indicating the same, or similar structural elements of FIG. 1.

As indicated in FIG. 1(a), in the high frequency transmission line according to this embodiment, while a dielectric substrate 2 is commonly used by a microstrip signal line (MSL) and a triplate signal line (TSL), a ground conductor 1 which is commonly used by both the microstrip line and the triplate line has been formed on a lower plane (namely, lower layer) of this dielectric substrate 2. On the other hand, a signal line 3 of the microstrip line has been formed on an upper plane (namely, upper layer) of the dielectric substrate 2, and furthermore, a ground conductor 5 which constitutes the triplate line has been formed with having a predetermined interval with respect to this signal line 3.

Also, a signal line 4 of the triplate line is embedded in an inner portion (namely, inner layer) of the dielectric substrate 2 in such a manner that this signal line 4 is sandwiched by the ground conductor 1 and the ground conductor 5. An edge portion of this signal line 4 of the triplate line is elongated along a direction of the microstrip line in both an area "A" and another area "B" in such a manner that the signal line 4 of the triplate line is overlapped with the signal line 3 of the microstrip line along a vertical direction. The signal line 3 of the microstrip line is connected to the signal line 4 of the triplate line at a substantially center of the area "A" by employing a via hole conductor 12, so that both the microstrip line and the triplate line are connected to each other.

As previously explained, FIG. 1(b) is a plan view for showing an area located in the vicinity of a connection portion between the above-explained microstrip line and the above-explained triplate line. A width of the edge portion of the signal line 3 of the microstrip line is formed in such a manner that this width is made narrower than a width of another signal line 3 in the area "A." As previously explained, both the signal line 3 of the microstrip line and the ground conductor 5 are arranged with having a predetermined interval between them in order that this signal line 3 is not short circuited with the ground conductor 5 in the area "B." Although not shown in this drawing, in this example, the width of the signal line 4 of the triplate line is made constant at any portions thereof. It should be understood that such the width of the area "A" of the signal line 3 is greater than the width of the signal line 4. Also, in FIG. 1(b), the ground conductor 5 is elongated in such a manner that this ground conductor 5 surrounds the signal line 3 of the microstrip line, and then, this elongated ground conductor 11 is electrically conducted to the ground conductor 1 formed on the lower plane via a predetermined via hole.

Generally speaking, both a characteristic impedance of a microstrip line and a characteristic impedance of a triplate line are changed in accordance with a width of the signal line 3 and a width of the signal line 4, respectively. As a consequence, at a place other than the area "A", the width of the signal line 3 is set to a predetermined value in such a manner that the characteristic impedance of this microstrip line become, for example, 50 ohms. Also, similarly, the width of the signal line 4 is set to a predetermined value in such a manner that the characteristic impedance of this triplate line becomes, for example, 50 ohms.

It should be understood that when a characteristic impedance of a microstrip line and a characteristic impedance of a triplate line are designed to become 50 ohms respectively, normally, a width of a signal line of the microstrip line is made wider than a width of a signal line of the triplate line due to a structural difference. As a result, also in the example shown in FIG. 1, the width of the signal line 3 becomes wider than the width of the signal line 4. As previously explained, it should be noted that even when the width of the signal line 3 is made narrow in the area "A", this width relationship between them may be maintained, and thus, such a relationship as to the width of the area "A" of the signal line 3 being greater than the width of the signal line 4 may be established.

As realized in the conventional method, in such a case that the signal line 3 is simply connected to the signal line 4 by using the via hole conductor 6, since the electromagnetic coupling phenomenon is newly produced among the signal line 3, the signal line 4, and the via hole conductor 6, the characteristic impedances thereof cannot be made of 50 ohms in the portion located near this connection portion under this condition, the reflectance of the signal is increased at this portion.

To this end, in this first embodiment, as shown in FIG. 1(b), the width (area "A") of the edge portion of the signal line 3 is made narrower than the width of another portion thereof. As a result, since the signal line width at the connection portion is changed in a step manner, a deviation of the impedances at this connection portion can be suppressed (namely, characteristic impedances at connection portion can be approximated to 50 ohms). As a consequence, the signal reflections occurred in the connection portion between the signal line 3 and the signal line 4 can be reduced, and even in such a case that the different high frequency transmission lines are connected to each other, the passing characteristic of the signal can be improved.

In accordance with this embodiment, since the width of the edge portion of the signal line 3 of the microstrip line is adjusted, the deviation of the characteristic impedances of the microstrip line and the triplate line at the connection portion can be decreased, and the impedances can be matched with each other. Thus, the signal reflectance can be reduced and the passing characteristic of the high frequency signal can be improved.

(Embodiment Mode 2)

Figure 2:
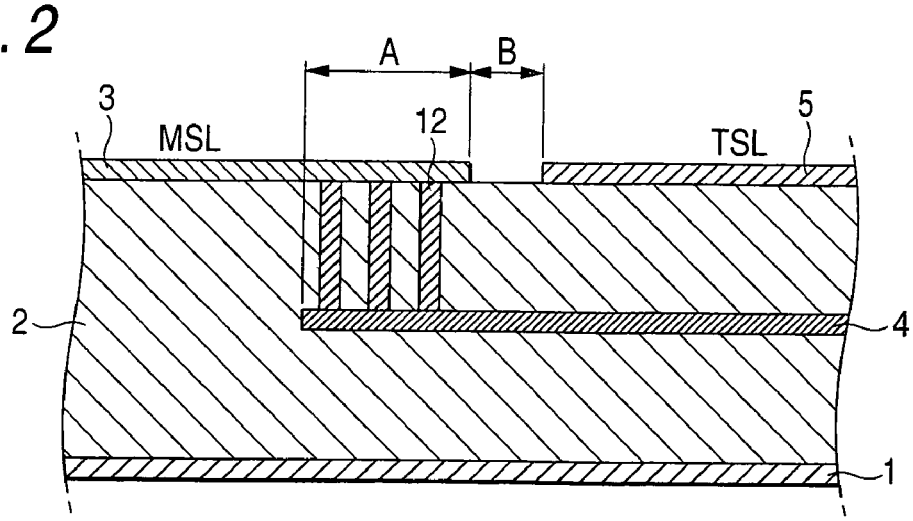
FIG. 2 is a sectional view for indicating a structure of a high frequency transmission line according to a second embodiment of the present invention.

FIG. 2 is a sectional view for showing a connection structure of a high frequency transmission line according to a second embodiment mode of the present invention. It should be noted that the same reference numerals indicated in the first embodiment mode will be employed as those for representing the same, or similar structural elements of the second embodiment mode.

Similar to the first embodiment, in the high frequency transmission line of this second embodiment, a width of a signal line 3 of a microstrip line (MSL) is made narrow in an area "A." However, this high frequency transmission line owns such a different point that the signal line 3 of the microstrip line is connected to a signal line 4 of a triplate line (TSL) by employing three pieces of via hole conductors 12, as compared with that of the first embodiment.

In accordance with this second embodiment, since these signal lines 3 and 4 are connected to each other by employing a plurality of the via hole conductors 12 in addition to the adjustment of the width of the signal line 3, a potential fluctuation between the signal lines 3 and 4 at the portion near the connection portion can be suppressed, which corresponds to one of reasons for conducting the deviation of the impedances. Therefore, reflectance of signals appeared in the connection portion is furthermore decreased, so that a signal passing characteristic can be improved.

It should also be noted that although this second embodiment has been arranged by that the signal line 3 of the microstrip line is connected to the signal line 4 of the triplate line by employing three pieces of the via hole conductors 12, these signal lines 3 and 4 may be alternatively connected to each other by employing two pieces, or more than four pieces of the above-explained via hole conductors 12. In view of such a technical aspect that a fluctuation of a potential is suppressed, it is preferable to connect these signal lines 3 and 4 to each other through a large number of via hole conductors as being permitted as possible. However, if a total number of via hole conductors is increased, then a resulting structure becomes complex. Therefore, it is preferable to determine the total number of these via hole conductors by considering also this technical aspect.

Also, in the above-described first embodiment and second embodiment, the- width of the signal line 3 of the microstrip line has been changed. Instead of this example, even if the width of the edge portion of the signal line 4 of the triplate line is widened in both the areas "A" and "B", then a similar effect may be achieved.

Also, in the above-described first embodiment and second embodiment, the width of the signal line 3 of the microstrip line has been changed. In addition to this example, the width of the edge portion of the signal line 4 of the triplate line may be widened in both the areas "A" and "B", as compared with the width of another portion thereof. As previously explained, since the widths of both the signal lines 3 and 4 are changed, the characteristic impedances thereof in the connection portions may be adjusted in a more precise manner. As a result, the deviation of the characteristic impedances in the connection portion can be furthermore reduced. Moreover, in this second embodiment, since the widths of the signal lines can be adjusted at two places, a degree of freedom in design can be increased.

(Embodiment Mode 3)

Figure 3:
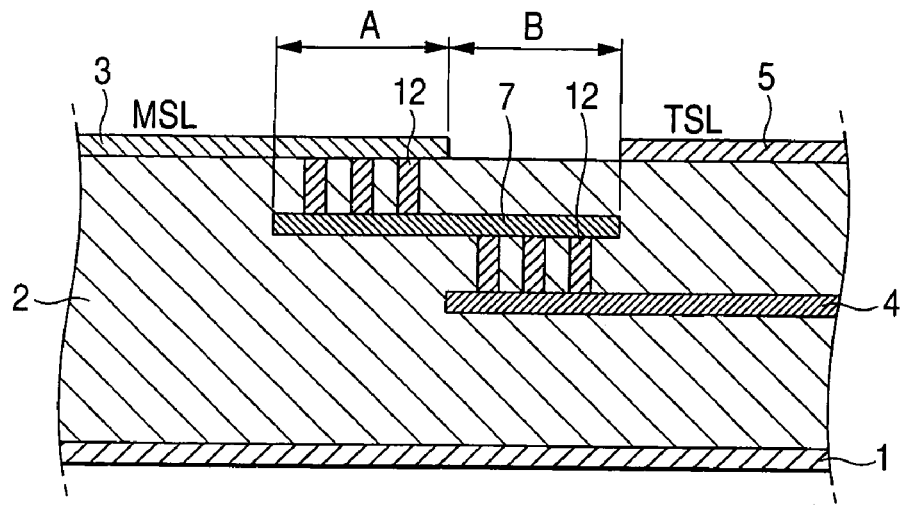
FIG. 3 is a sectional view for representing a structural of a high frequency transmission line according to a third embodiment of the present invention.

FIG. 3 is a sectional view for showing a connection structure of a high frequency transmission line according to a third embodiment mode of the present invention. It should be noted that the same reference numerals indicated in the first embodiment mode will be employed as those for representing the same, or similar structural elements of the third embodiment mode.

Similar to the first embodiment, a ground conductor 1 is formed on a lower plane (namely, lower layer) of a dielectric substrate 2, a signal line 3 of a microstrip line (MSL) and a ground conductor 5 of a triplate line (TSL) are formed on an upper plane (namely, upper layer) of the dielectric substrate 2. Also, a signal line 4 of a triplate line is embedded in an inner portion (namely, inner layer) of the dielectric substrate 2 in such a manner that this signal line 4 is sandwiched by the ground conductors 1 and 5. It should also be noted that an edge portion of the triplate line 4 is elongated along a direction of the microstrip line in an area "B."

In the inner portion of the dielectric substrate 2, a signal line 7 is embedded in a layer between the signal line 3 of the microstrip line and the signal line 4 of the triplate line. This signal line 7 is formed in such a manner that one edge of this signal line 7 is overlapped with the signal line 3 along a vertical direction (area "A"), and another edge thereof is overlapped with the signal line 4 along the vertical direction (area "B"). Then, this signal line 7-is connected to the signal line 3 by employing three pieces of via hole conductors 12 in the area "A", and is similarly connected to the signal line 4 by employing three pieces of via hole conductors 12 in the area "B." As explained above, in this third embodiment, the signal line 3 of the microstrip line is connected via the signal line 7 to the signal line 4 of the triplate line.

Figure 4:
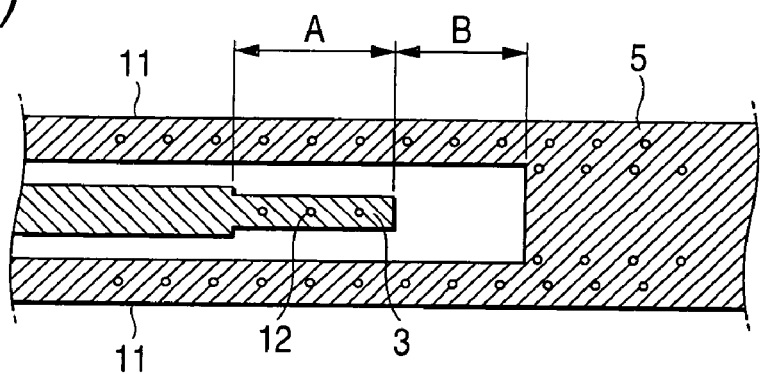
FIGS. 4A to 4C are plan views for indicating an upper plane of a signal line located in the vicinity of a connection portion of the microstrip line and the triplate line, which are indicated in FIG. 3.
Figure 4:
Figure 4:
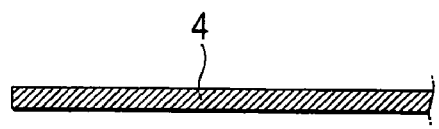

FIG. 4 is a plan view for indicating upper planes of the signal lines 3 and 4 of the microstrip line and the triplate line at a portion located in the vicinity of a connection portion thereof, and an upper plane of the signal line 7 at this portion. FIG. 4(*a*) represents the signal line 3 of the microstrip line at an area near the region "A", and in this region "A", a width of an edge portion of the signal line 3 is made narrower than that of another portion thereof. FIG. 4(*b*) shows the signal line 7 which is arranged between the signal line 3 and the signal line 4, and is bridged over the area "A" and the area "B" of the above-explained connection portion, and the width of this signal line 7 is made narrower than the width of the signal line 3 in the area "A." FIG. 4(*c*) represents the signal line 4 of the triplate line at an area near the region "B" of the above-described connection portion, and a width of the signal line 4 is made constant. It should also be understood that as to a relationship between the signal line 7 and the signal line 4, in this example, such a relationship of the width of the signal line 7 larger than the width of the signal line 4 is established.

As previously explained, a characteristic impedance of a microstrip line and a characteristic impedance of a triplate line can be changed based upon a width of the signal line 3 and a width of the signal line 4 respectively. Therefore, in a place other than the area "A", the width of the signal line 3 is set to a predetermined value in such a manner that the characteristic impedance of this microstrip line may become, for example, 50 ohms. Also, similarly, the width of the signal line 4 is set to a predetermined value in such a manner that the characteristic impedance of this triplate line may become, for example, 50 ohms.

Figure 16:
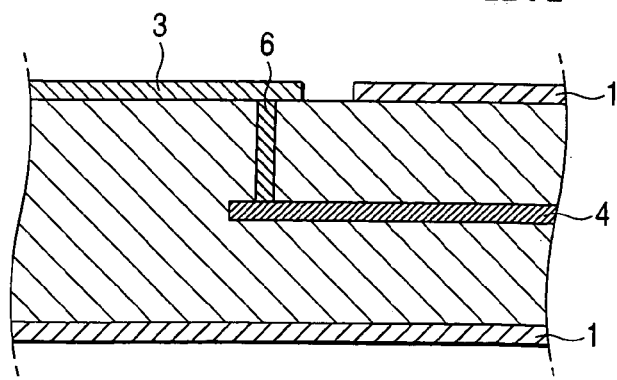
FIG. 16 is a sectional view for representing the connection structure of the conventional microstrip line and the conventional triplate line.

However, as previously explained in the conventional manner as shown in FIG. 16, in such a structure that the signal line 3 is simply connected to the signal line 4 by using the via hole conductor 6, since the electromagnetic coupling phenomenon is newly produced among the signal line 3, the signal line 4, and the via hole conductor 6, the characteristic impedances of this connection portion could not be made of 50 ohms, so that the reflection of the signals occurred. As a consequence, in this third embodiment, in addition to such a condition that the width of the edge portion of the signal line 3 is changed, the signal line 7 is further arranged between the signal line 3 and the signal line 4, and the signal line 3 of the microstrip line is connected to the signal line 4 of the triplate line through the signal line 7. As a result, the deviation of the impedances in the connection portion can be suppressed, and the signal reflections can be suppressed.

Concretely speaking, in this third embodiment case, the widths of the respective signal lines are set under the below-mentioned relationship in order that deviations of characteristic impedances of the respective sectional planes having different structures may be decreased as being permitted as possible. This relationship is defined by (the width of the signal line 3)>(the width of the signal line 3 in the area "A")>(the width of the signal line 7)>(the width of the signal line 4). In other words, the width of the signal line is made in such a manner that this width is gradually approximated from the width of the signal line 3 of the microstrip line to the width of the signal line 4 of the triplate line. This third embodiment may avoid that the width of the signal line of the conventional method is changed from the signal line width of the microstrip line to the signal line width of the triplate line in short order. Also, since the signal line 7 is inserted between the signal line 3 and the signal line 4, a distance between the signal lines may be shortened, as compared with that of the conventional method. As a result, fluctuations of potentials between the signal lines may be suppressed. Also, since the signal line 7 is inserted, a total number of connection points is increased, and thus, such points which cause the deviation of the impedances can be distributed. With employment of such a structure, in this third embodiment case, while the deviation of the impedances in the connection portion may be suppressed, the characteristic impedance of this connection portion can be furthermore approximated to the characteristic impedance of the microstrip line and the characteristic impedance of the microstrip line.

Figure 5:
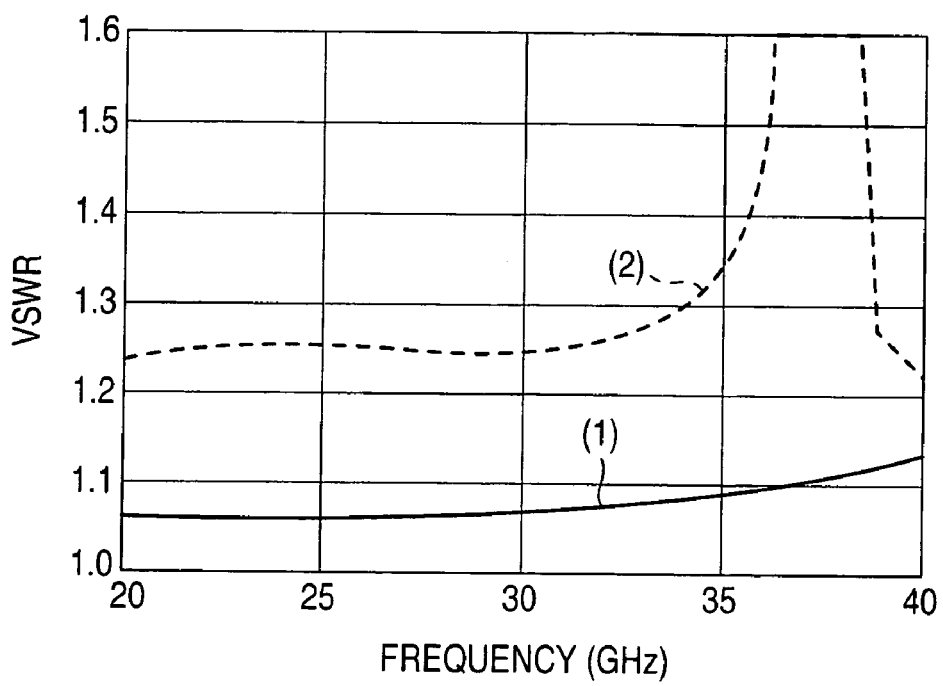
FIG. 5 is a characteristic diagram for representing a VSWR characteristic of the structure of the high frequency transmission line shown in FIG. 3.

Since such a structure is employed, a VSWR of the line which contains the connection portion of the signal line 3 and the signal line 4 becomes smaller than, or equal to 1.1 within a frequency range from 20 GHz to 35 GHz, as represented in reference numeral (1) of FIG. 5, so that it can be understood that there is a very small reflection. However, in the prior art, as shown in reference numeral (2) of FIG. 5, the VSWR is large in the entire frequency range, so that it can be seen that there is a large reflection.

In accordance with this third embodiment, the signal line 7 is provided between the signal line 3 and the signal line 4, and also, while both the width of the edge portion (area "A") of the signal line 3 and the width of the signal line 7 are set to the proper widths, the signal line 3 is connected to the signal line 4 via the signal line 7. As a result, the deviation of the impedances in the connection portion can be reduced, so that the signal reflections can be decreased and the passing characteristic can be improved. In other words, since the adjustment is carried out in two stages, namely, the signal line 7 is inserted and both the widths of the signal lines 3 and 7 are changed, the deviation of the impedances in the connection portion is distributed, and the deviation of the impedances can be reduced, and also, the signal reflections in the connection portion can be reduced.

It should also be noted that in the above-described third embodiment, the widths of the respective lines have been set in such a manner that the width of the signal line 3>the width of the signal line 3 in the area "A">the width of the signal line 7>the width of the signal line. Even when the width of the signal line 7 is made equal to the width of the signal line 4, it is possible to avoid that the line width is changed from the signal line 3 to the signal line 4 in short order, and also, the distance between the respective lines can be shortened. As a result, at least, such an effect may be achieved by which the signal reflections can be reduced, as compared with that of the conventional method. Alternatively, while the width of the signal line 3 is not changed, the signal line 7 which may establish such a relationship of the signal line 3>the signal line 7>the signal line 4 may be simply inserted. Moreover, while the width of the signal line 3 is not changed, the signal line 7 is inserted even in such a relationship of the signal line 3=the signal line 7>the signal line 4, or even in such a relationship of the signal line 3>the signal line 7=the signal line 4. As a consequence, a distance between the signal lines may become short, as compared with the distance of the prior art. At least, such an effect may be achieved by which the signal reflections can be reduced, as compared with that of the conventional method.

Also, in the above-described third embodiment, the width of the signal line 3 of the microstrip line in the area "A" has been changed with respect to the width of another portion thereof. Furthermore, the width of the signal line 4 of the triplate line in the area "B" may be alternatively changed with respect to the width of another portion thereof. In this alternative case, since the portions whose line width can be adjusted become three portions, the characteristic impedance of the connection portion may be more precisely adjusted and the degree of design freedom may be improved. Also, if the line widths of the signal line 7 may be changed at a portion thereof located opposite to the signal line 3 and another portion thereof located opposite to the signal line 4, then portions of this signal line 7, whose line widths may be adjusted, may be increased, so that the precision of the adjustment and the degree of design freedom may be improved.

Also, in the above-described third embodiment, the signal line 3 is connected to the signal line 7 by employing the three via hole conductors 12, as well as the signal line 7 is connected to the signal line 4 by employing the three via hole conductors 12. Alternatively, even when any one, or both the connection portions may be connected to each other by using one via hole conductor 12, signal reflectance at the connection portion of the microstrip line and the triplate line may be decreased, and the passing characteristic of the signal may be improved.

Moreover, a total number of via hole conductors 12 which are used to connect the signal line 3 with the signal line 7 and also to connect the signal line 7 with the signal line 4 respectively may be selected to be 2, or more than 4.

Figure 6:
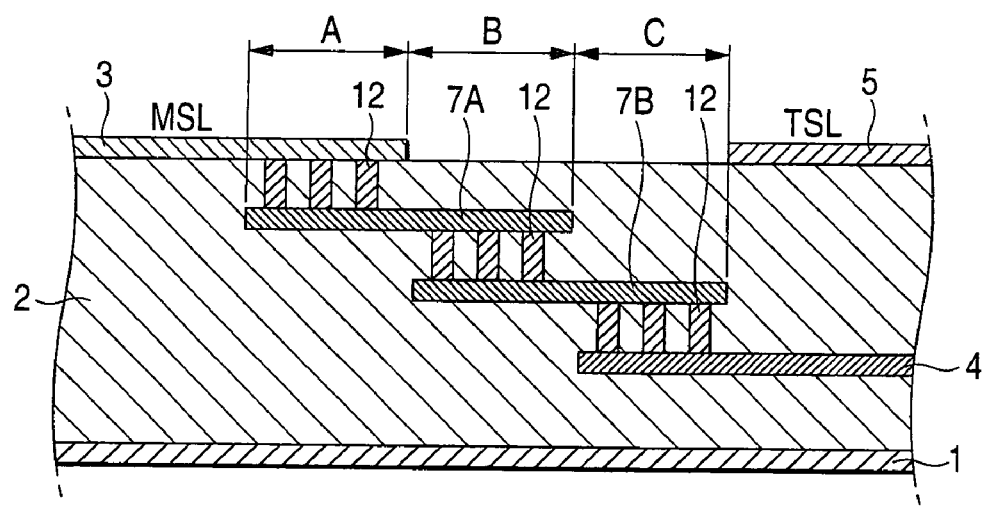
FIG. 6 is a sectional view for indicating a modification of the high frequency transmission line according to the third embodiment of the present invention.

Also, in the above-explained embodiment, the signal line 3 is connected to the signal line 4 by interposing one piece of the signal line 7. Alternatively, as represented in FIG. 6, two pieces of signal lines 7*a* and 7B may be interposed between the signal lines 3 and 4. In this alternative case, widths of the respective lines may be set to satisfy, for example, such a relationship of the signal line 3>the signal line 7A>signal line 7B>the signal line 4 in order that deviation of characteristic impedances of connection portions having different structures is decreased as being permitted as possible. In addition to such a line relationship, as explained in the above-described embodiment, a width of an edge portion of the signal line 3 may be changed in an area "A", and a width of an edge portion of the signal line 4 may be changed in an area "C." Also, widths of the respective lines may have, for instance, such a line relationship of the signal line 3=signal line 7A>the signal line 7B>the signal line 4, or such a line relationship of the signal line 3>the signal line 7A>the signal line 7B=the signal line 4. Furthermore, two, or more pieces of signal lines 7 may be inserted between the signal line 3 and the signal line 4. In summary, at least one, or more pieces of lines are inserted between the signal line 3 and the signal line 4 in such a manner that these lines are arranged in a step manner by overlapping one edge thereof with a line of an upper layer and by overlapping the other edge thereof with a line of a lower layer, and furthermore, overlapping portions are connected to each other. While a width of at least a partial line among these lines is set to be such a width defined between the width of the signal line 3 and the width of the signal line 4, the widths of the signal lines are adjusted in such a manner that these line widths are changed in a step manner. Since such a line structure is employed, the deviations of the impedances in the connection portions are distributed and thus can be decreased, so that signal reflections occurred in the connection portions can be reduced.

(Embodiment Mode 4)

Figure 7:
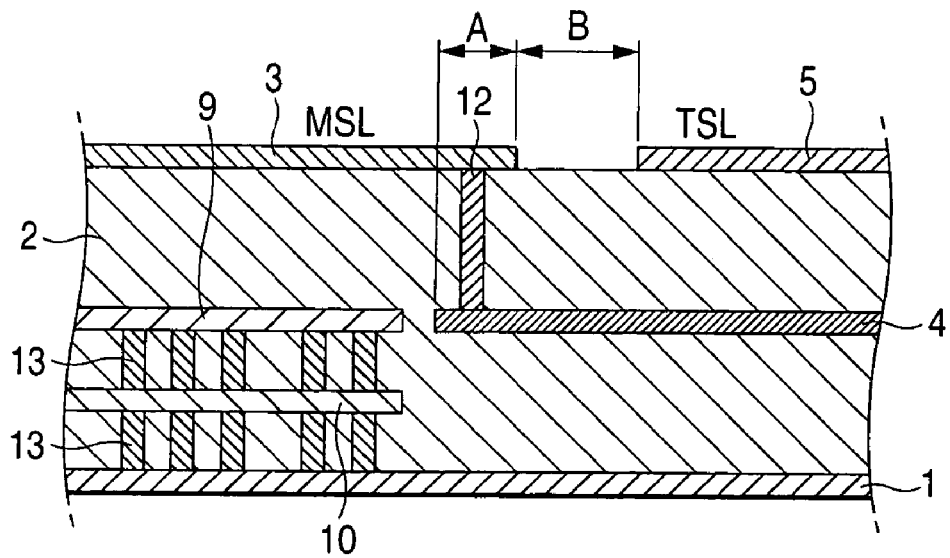
FIG. 7 is a sectional view for representing a structural of a high frequency transmission line according to a fourth embodiment of the present invention.

FIG. 7 is a sectional view for showing a connection structure of a high frequency transmission line according to a fourth embodiment mode of the present invention. It should be noted that the same reference numerals indicated in the first embodiment mode will be employed as those for representing the same, or similar structural elements of the fourth embodiment mode.

The high frequency transmission line of this fourth embodiment owns such a structure that a signal line 3 of a microstrip line (MSL) is connected to a signal line 4 of a triplate line (TSL) by employing one piece of a via hole conductor 12. On the other hand, a conductor 9 is provided just under the signal line 3 of the microstrip line at a position of the substantially same layer with respect to the signal line 4, and furthermore, another conductor 10 is provided under this conductor 9. These conductors 9 and 10 are connected to a ground conductor 1 through a via hole conductor 13, while this ground conductor 1 has been formed on a lower plane of a dielectric substrate 2.

The above-explained conductors 9 and 10 which are arranged just under the signal line 3 of the microstrip line may function as a ground conductor with respect to the signal line 3, and may have such an effect capable of shortening a distance between the signal line 3 and the ground conductor. In this case, a characteristic impedance of the microstrip line is changed based upon a distance between the signal line 3 and the ground conductor, and as explained above, this distance is also changed based upon the width of the signal line 3.

In such a case that the characteristic impedance of the microstrip line is set to, for example, 50 ohms, as explained above, when the distance between the signal line 3 and the ground conductor becomes short, in order to maintain the characteristic impedance at 50 ohms, the width of the signal line 3 may be made narrow, which may be understood from a simulation, and the like.

As a consequence, if the distance between the signal line 3 of the microstrip line and the ground conductor is made short by way of the conductors 9 and 10 which are connected to the ground conductor 1, then the width of the signal line 3 becomes narrow. Now, in such a case that the width of the signal line 3 of the microstrip line is made wider than the width of the signal line 4 of the triplate line, as previously explained, if the width of the signal line 3 becomes narrow due to the effects of the conductors 9 and 10, then a difference between this width of the signal line 3 and the width of the signal line 4 can be reduced, which can avoid that the width of the conductor is changed in short order as explained in the prior art. As a result, signal reflections occurred in a connection portion of the microstrip line and the triplate line can be reduced.

In accordance with this fourth embodiment, since the distance between the signal line 3 of the microstrip line and the ground conductor is made short by way of the conductors 9 and 10 which are connected to the ground conductor 1, the width of the signal line 3 can be approximated to the width of the signal line 4 of the triplate line, so that the signal reflections occurred in the connection portion between the signal line 3 and the signal line 4 can be decreased, and the passing characteristic of the signal in the connection portion can be improved.

It should also be noted that similar to the first embodiment, in accordance with this fourth embodiment, only the width of the signal line 3 of the microstrip line may be adjusted, or both the width of the signal line 3 and the width of the signal line 4 of the triplate line maybe adjusted. In this alternative case, since a plurality of parameters can be used, the characteristic impedances of the connection portion may be adjusted in a higher precision manner than that of the first embodiment, or may be alternatively adjusted by more widely selecting dimensions. As a consequence, while the deviation of the impedances of this connection portion may be furthermore suppressed, the signal reflections thereof may be decreased.

(Embodiment Mode 5)

Figure 8:
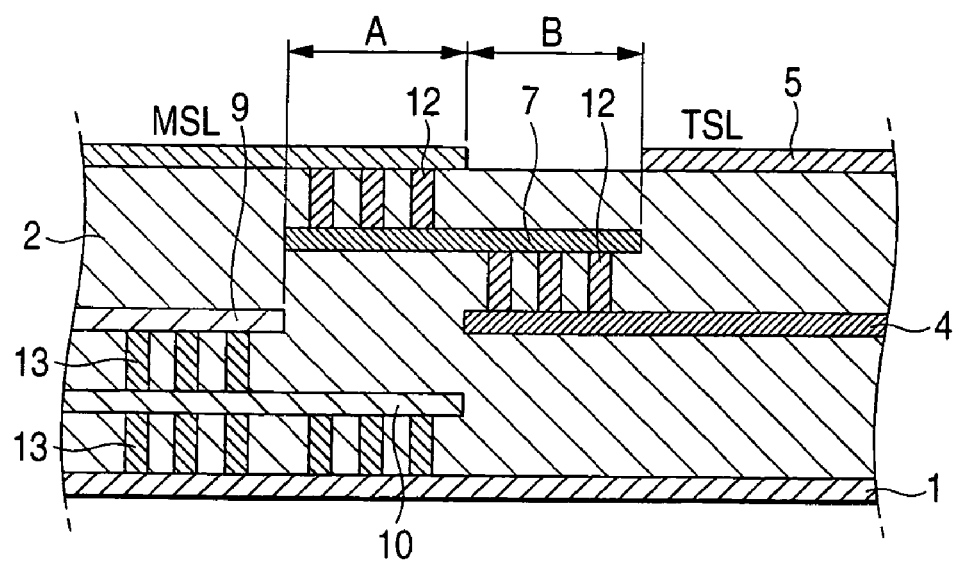
FIG. 8 is a sectional view for indicating a structure of a high frequency transmission line according to a fifth embodiment of the present invention.

FIG. 8 is a sectional view for showing a connection structure of a high frequency transmission line according to a fifth embodiment mode of the present invention. It should be noted that the same reference numerals indicated in the third embodiment mode will be employed as those for representing the same, or similar structural elements of the fifth embodiment mode.

The high frequency transmission line of this fifth embodiment is constituted as follows: That is, while a signal line 7 is embedded in a dielectric substrate 2 between a signal line 3 of a microstrip line (MSL) and a signal line 4 of a triplate line (TSL), the signal line 3 is connected to this signal line 7 by employing three pieces of via hole conductors 6, and furthermore, this signal line 7 is connected to the signal line 4 by using three pieces of via hole conductors 6. Also, a line width of the signal line 3 in an area "A" of a connection portion between the microstrip line and the triplate line becomes narrower, as compared with a line width of another portion thereof. There is such a relationship of the width of the signal line 3 in the area "A">the width of the signal line 7>the width of the signal line 4. The high frequency transmission line owns a similar connection structure to that of the third embodiment.

On the other hand, similar to the fourth embodiment, conductors 9 and 10 are provided just under the signal line 3 of the microstrip line. These conductors 9 and 10 are connected to a ground conductor 1 by employing a via hole conductor 13. It should also be understood that in this example, the conductor 10 is elongated to a portion just under the signal line 7, and is extended up to the area "A."

Both the conductors 9 and 10 which are arranged just under the signal line 3 of the microstrip line and the signal line 7 may shorten both a distance between the signal line 3 and the ground conductor 1 and another distance between the signal line 7 and the ground conductor 1.

As explained above, if the distances between the signal line 3 and the ground conductor 1 and the signal line 7 and the ground conductor 1 are made short, similar to the fourth embodiment, then widths of both the signal lines 3 and 7 can be narrowed, and a difference between these line widths of the signal lines 3 and 7 and the line width of the signal line 4 can be reduced.

Therefore, in this fifth embodiment case, the line width can be changed in a step manner by the signal line 7, and furthermore, the difference between these line widths can be reduced. As a consequence, in this fifth embodiment case, while a deviation of impedances in a connection portion is furthermore suppressed, the signal reflections occurred in this connection portion can be lowered, as compared with that of the third embodiment.

In this fifth embodiment, since the distance between the signal line 3 of the microstrip line and the ground conductor of the intermediate signal line 7 can be shortened by the conductors 9 and 10 which are connected to the ground conductor 1 by employing the via hole conductor 13, the difference of the line widths among the respective lines can be shortened. While the deviation of the impedances in the connection portion is furthermore suppressed, the signal reflections occurred in this connection portion can be reduced.

Also, in this fifth embodiment case, impedance adjusting parameters in the connection portion can be selected to be two sorts of such parameters, namely the widths of the signal lines and the distances between the signal lines and the ground conductors. As a result, a degree of design freedom can be further improved.

It should be understood of that the width of the signal line 3 of the microstrip line in the area "A" is changed with respect to the width of another portion thereof in the above-explained fifth embodiment. Alternatively, in addition to such an adjustment that the width of the signal line 4 of the triplate line in the area "B" is changed with respect to the width of another portion thereof, the distance between the signal line 3 of the microstrip line and the ground conductor of the intermediate signal line 7 may be alternatively shortened so as to adjust the impedances in the connection portion. Thus, a similar effect may be achieved.

(Other Embodiments)

Figure 9:
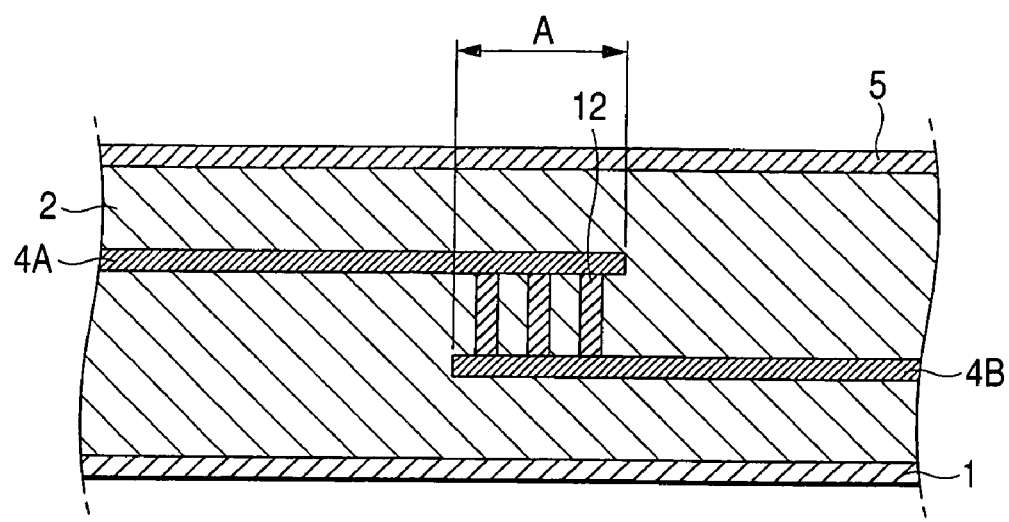
FIG. 9 is a sectional view for representing a high frequency transmission line according to another embodiment of the present invention.

In the above-described embodiments, such a case has been explained in which the microstrip line having the signal line 3 on the upper plane of the dielectric substrate 2 has been connected to the triplate line having the signal line 4 inside the dielectric substrate 2. As indicated in FIG. 9, even when the present invention is applied to such a case that triplate lines are connected to each other in which signal lines 4A and 4B are arranged in different layers, a similar effect to that of the above-explained case may be achieved. In this alternative case, if either one or both line widths of the signal lines 4A and 4B are adjusted so as to decrease a difference between the line widths, then a deviation of impedances in a connection portion may be suppressed, and thus, signal reflections occurred in the connection can be reduced.

Also, the present invention is not limited to this case, but may be applied to another structure. That is, in addition to the structure shown in FIG. 9, as shown in FIG. 3, a signal line 7 may be inserted between the signal lines 4A and 4B, and then, the signal line 4A may be connected to the signal line 4B through this signal line 7. When the line width of the signal line 7 is adjusted in such a structure, the width of the signal line may be alternatively changed in a step manner, so that signal reflections occurred in a connection portion may be furthermore reduced.

Also, the present invention is not limited to this case, but may be applied to another structure. That is, in such a case that both the signal line 4A and the signal line 4B own different line widths from each other, when both the signal lines 4A and 4B are located in the same layer, a width of an edge portion of either one or both the signal lines may be changed from a width of another portion thereof so as to be adjusted, and then, the signal line 4A may be directly connected to the signal line 4B without through a via hole conductor. In this alternative case, at least, it is possible to avoid that the widths of the signal lines are changed in short order. As a result, signal reflections occurred in a connection portion may be reduced, as compared with that of such a case that the edge portions are simply connected to each other.

Figure 10:
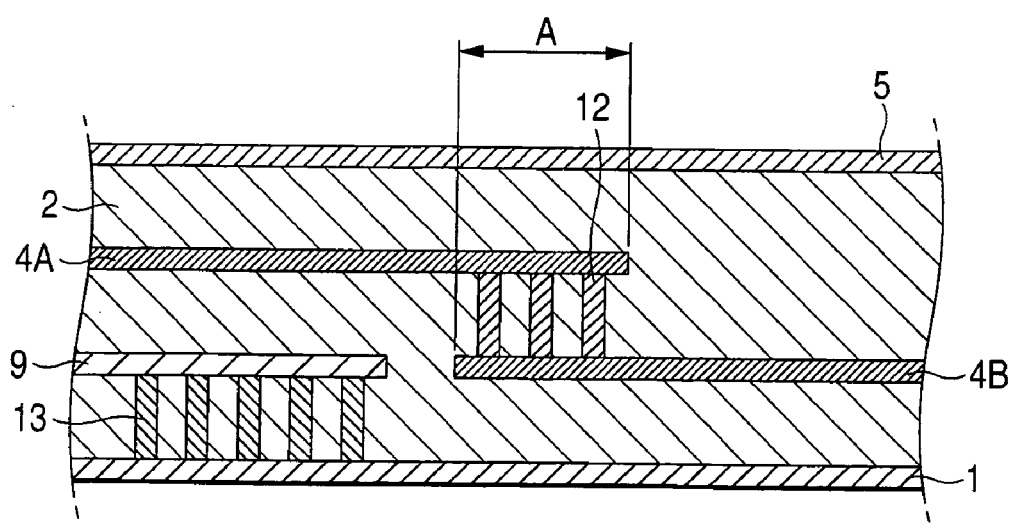
FIG. 10 is a sectional view for indicating a high frequency transmission line according to another embodiment of the present invention.

Furthermore, as shown in FIG. 10, in addition to the structure represented in FIG. 9, a conductor 9 is provided under the signal line 4A, and this conductor 9 is connected to the ground conductor 1 through a via hole conductor 13. As a result, similar to the above-described fourth embodiment, even when the distance between the signal line 4A and the ground conductor 1 is shortened and the width of the signal line 4A is adjusted, a similar effect to that of the above-explained case may be achieved.

Figure 11:
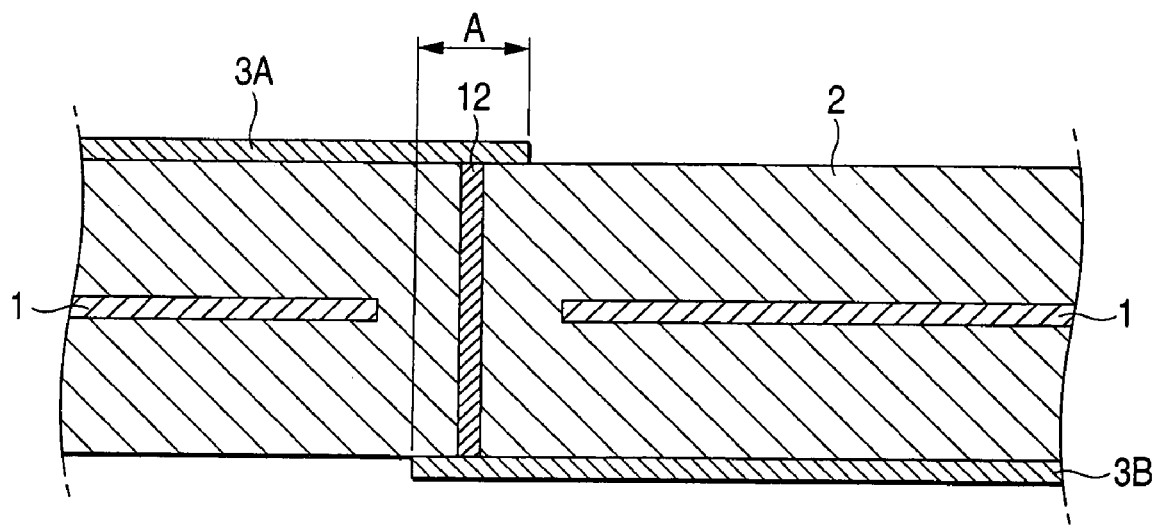
FIG. 11 is a sectional view for representing a high frequency transmission line according to another embodiment of the present invention.

Also, the present invention is not limited to this embodiment, but even when the present invention is applied to another case shown in FIG. 11, a similar effect to that of the above-described case may be achieved. That is, in FIG. 11, such a microstrip line which owns a signal line 3A on an upper plane (upper layer) of a dielectric substrate 2 and a ground conductor 1 in an inner portion (inner layer) of the dielectric substrate 2 is connected to another microstrip line which owns a signal line 3B on a lower plane (lower layer) of the dielectric substrate 2 and a ground conductor 1 in an inner portion of the dielectric substrate 2. In this case, as explained in the above-described first embodiment, the line width of the signal line 3A and a width of another portion thereof may be changed in a step manner so as to be approximated to the signal line 3B in an area "A." Alternatively, instead of the signal line 3A, the line width of the signal line 3B may be changed in the area "A." Also, both the line width of the signal line 3A and the line width of the signal line 3B may be alternatively changed.

Figure 12:
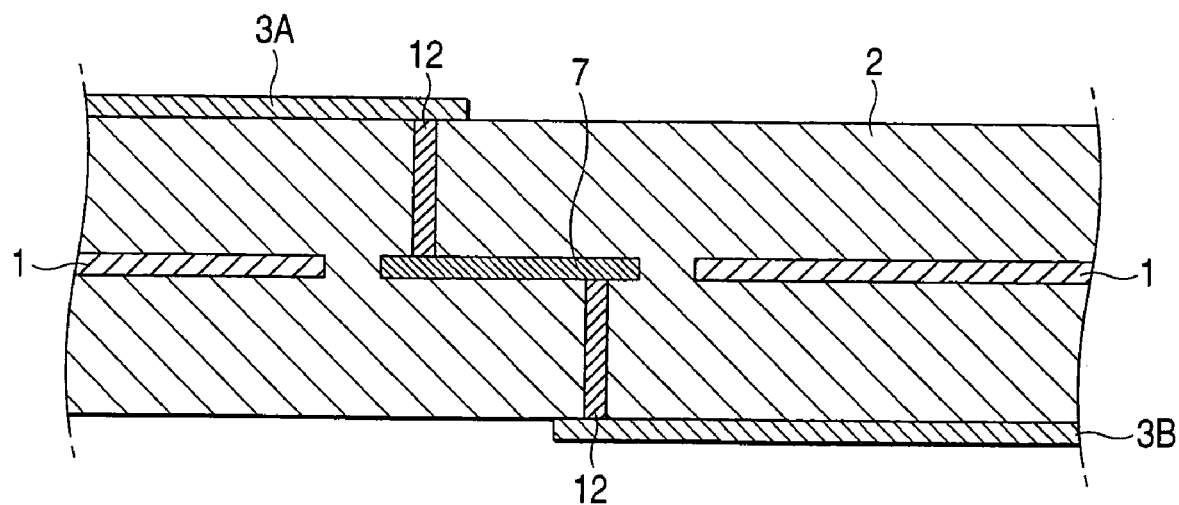
FIG. 12 is a sectional view for indicating a high frequency transmission line according to another embodiment of the present invention.

Moreover, the present invention is not limited only to this example, as shown in FIG. 12, in addition to the structure indicated in FIG. 11, similar to the above-explained third embodiment, a signal line 7 may be inserted into a layer between a signal line 3A and a signal line 3B, and the signal line 3A may be alternatively connected to the signal line 3B by employing this signal line 7. In this alternative case, a line width of the signal line 7 may have such a line relationship of the signal line 3A>the signal line 7>the signal line 3B. Otherwise, this line width of the signal line 7 may have such a line relationship of the signal line 3A=signal line 7>the signal line 3B, or the signal line 3A>the signal line 7=the signal line 3B. Alternatively, a line width of an edge portion of the signal line 3a and/or the signal line 3B may be adjusted. As previously explained, if the signal line 7 is inserted and the signal widths as to the signal lines 3A, 3A, 7 are adjusted, a similar effect to that of the above-described case may be achieved.

Figure 13:
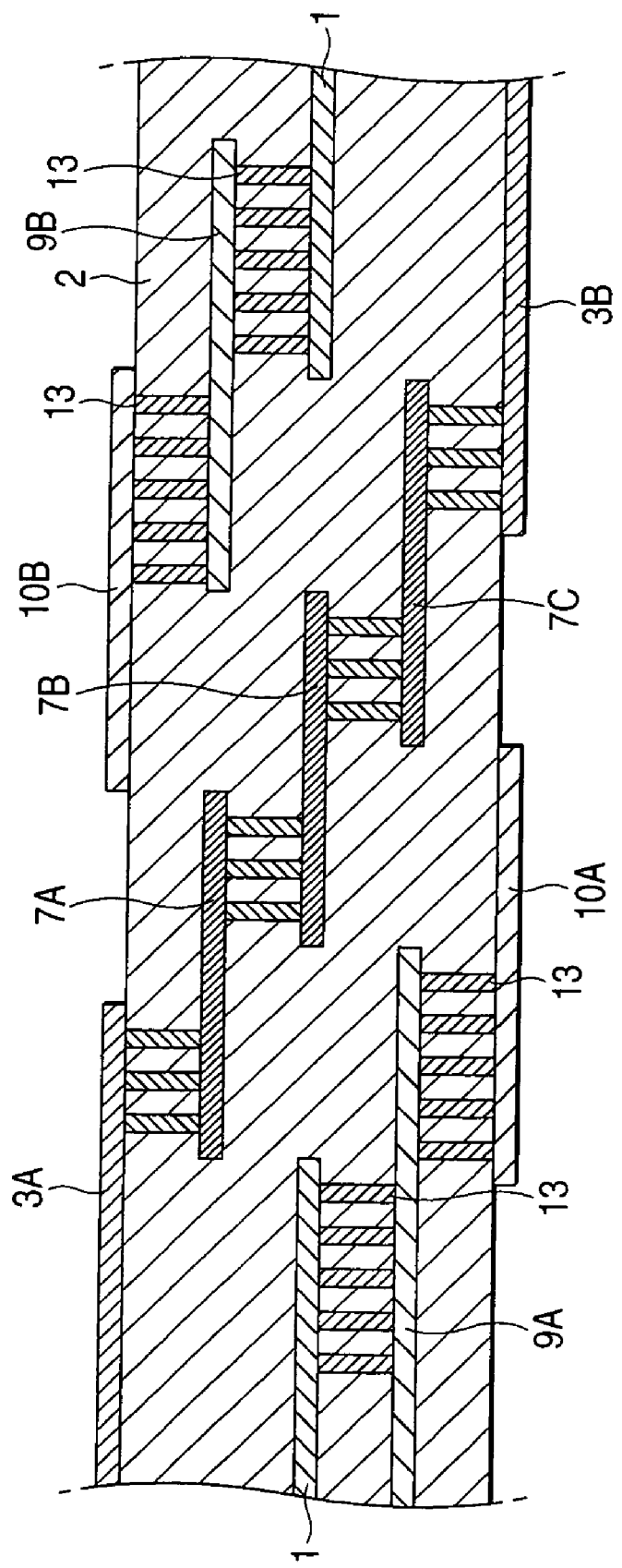
FIG. 13 is a sectional view for representing a high frequency transmission line according to another embodiment of the present invention.
Figure 14:
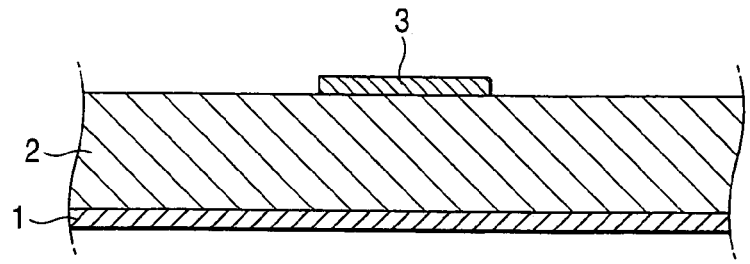
FIG. 14 is a sectional view for showing the structure of the conventional microstrip line.
Figure 15:
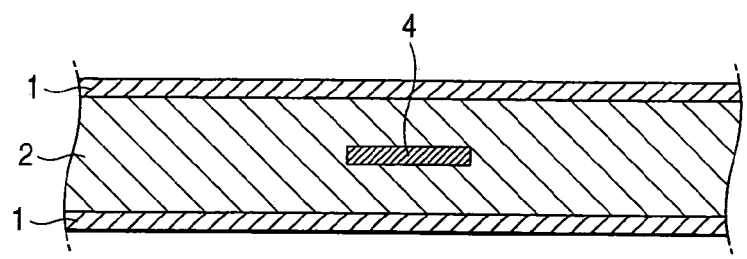
FIG. 15 is a sectional view for indicating the structure of the conventional triplate line.

Moreover, the present invention is not limited only to this example, as shown in FIG. 13, in addition to the structure indicated in FIG. 12, while a signal line 7 is constructed of three stages, i.e., a plurality of signal lines 7A, 7B, 7C, if line widths of these signal lines 7A, 7B, 7C are adjusted, then deviations of impedances of connection portions can be furthermore reduced, and thus, such a high frequency transmission line having a low signal reflection can be realized. Moreover, in addition to this structure, while conductors 9A, 10A, 9B, 10B may be additionally employed, these conductors 9A, 10, 9B, and 10B may be alternatively connected to the ground conductor 1 through a via hole conductor 13. As a result, similar to the above-described fifth embodiment, even when the distance of the ground conductor 1 with respect to the signal lines 7A, 7B, 7C is made short, a similar effect to that of the above-described case may be achieved.

Also, in the above-described embodiments, the description has been made of such a case that microstrip lines and triplate lines have been employed as transmission lines. The present invention is not limited only to this case, but may be realized by such a case that, for example, a coplanar line having both a signal line and a ground conductor on a upper plane of a dielectric substrate is employed, so that a similar effect may be achieved.

It should also be understood that the present invention is not restricted only to the above-explained embodiments, but may be realized by various embodiment modes as to concrete structures, functions, operations, and effects without departing from the gist of the present invention. For instance, although a via hole conductor has been employed so as to connect a microstrip line to a triplate line in the above-described embodiment, a through hole conductor may be alternatively employed.

As previously described in detailed, in accordance with the present invention, since a width of an edge portion of a signal line of a first high frequency transmission line is changed with respect to a width of another portion thereof, a deviation of impedances in a connection portion of the first and second high frequency transmission lines can be suppressed, so that signal reflections occurred in the connection portion can be reduced and a signal passing characteristic can be improved.

Also, since a width of an edge portion of a signal line of the second high frequency transmission line is also changed with respect to a width of another portion thereof, a deviation of impedances in the connection portion of the first and second high frequency transmission lines can be further suppressed, so that signal reflections occurred in the connection portion can be reduced and a signal passing characteristic can be improved.

Further, since a third signal line is provided between a first signal line of the first high frequency transmission line and a second signal line of the second high frequency transmission line, a distance among the signal lines can be made short, a deviation of impedances in connection portions can be reduced. As a result, signal reflections occurred in the connection portions can be reduced, and the signal passing characteristic can be furthermore improved.

Also, since the third signal line is formed by at least one, or more lines which have been fabricated in a hierarchical manner, and a line width is changed in a step manner, deviations of impedances in connection portions can be furthermore decreased.

Further, since a conductor capable of shortening a distance to a ground conductor is employed, deviations of impedances in connection portions can furthermore reduced, so that signal reflections occurred in the connection portions can be reduced and the signal passing characteristic can be moreover improved.

What is claimed is:

1. A high frequency transmission line comprising:
   a first high frequency transmission line having a signal line in a layer of a dielectric substrate;
   a second high frequency transmission line having a signal line in a different layer of a dielectric substrate;
   a third signal line which is provided in a layer between said first signal line of said first high frequency transmission line and said second signal line of said second high frequency transmission line,
   a first connection conductor for connecting said first signal line to said one edge of said third signal line; and
   a second connection conductor for connecting said second signal line to said another edge of said third signal line.
   wherein a width of said third signal line is set to be between the width of said first signal line and said second signal line.

2. A high frequency transmission line as claimed in claim 1, wherein an edge portion of said first signal line connected to said first connection conductor owns a line width different from a line width of another portion thereof.

3. A high frequency transmission line as claimed in claim 1, wherein an edge portion of said second signal line connected to said second connection conductor owns a line width different from a line width of another portion thereof.

4. A high frequency transmission line as claimed in claim 1 wherein said third signal line is arranged in a step form in such a manner that one edge of said third signal line is overlapped with a line of an upper layer and another edge of said third signal line is overlapped with a line of a lower layer, and owns at least one, or more lines, the overlapped portions of which are connected to each other; a line width of a partial line within said lines is defined between a width of said first signal line and a width of said second signal line; and the line width is changed in a step manner among the lines.

5. A high frequency transmission line as claimed in claim 1, further comprising: a conductor for shortening a distance between said first signal line and a ground conductor.

6. A high frequency transmission line as claimed in claim 1, including a plurality of the first connection conductors and a plurality of the second connection conductors.

7. A high frequency board which conducts a high frequency signal to a high frequency circuit via a high frequency transmission line containing signal lines in different layers of a dielectric substrate, wherein the high frequency transmission line comprising:
   a first high frequency transmission line having a signal line in a layer of a dielectric substrate;
   a second high frequency transmission line having a signal line in a different layer of the dielectric substrate;
   a third signal line which is provided in a layer between said first signal line of said first high frequency transmission line and said second signal line of said second high frequency transmission line, and which is formed in such a manner that one edge of said third signal line is overlapped with said first signal line and another edge thereof is overlapped with said second signal line;
   a first connection conductor for connecting said first signal line to said one edge of said third signal line; and
   a second connection conductor for connecting said second signal line to said another edge of said third signal line,
   wherein a width of said third signal line is set to be between the width of said first signal line and said second signal line.

8. A high frequency board as claimed in claim 7, including a plurality of the first connection conductors and a plurality of the second connection conductors.

* * * * *